United States Patent
Tu et al.

(10) Patent No.: US 9,735,193 B2
(45) Date of Patent: Aug. 15, 2017

(54) PHOTO RELAY

(71) Applicant: BRIGHT TOWARD INDUSTRIAL CO., LTD., New Taipei (TW)

(72) Inventors: Kao-Way Tu, New Taipei (TW);
Yuan-Shun Chang, New Taipei (TW);
Tzu-Hsu Hsu, Taipei (TW)

(73) Assignee: BRIGHT TOWARD INDUSTRIAL CO., LTD., New Taipei (TW)

( * ) Notice: Subject to any disclaimer, the term of this patent is extended or adjusted under 35 U.S.C. 154(b) by 0 days.

(21) Appl. No.: 15/363,459

(22) Filed: Nov. 29, 2016

(65) Prior Publication Data

US 2017/0179184 A1 Jun. 22, 2017

(30) Foreign Application Priority Data

Dec. 16, 2015 (TW) .............................. 104142310 A

(51) Int. Cl.
| | |
|---|---|
| H01L 25/16 | (2006.01) |
| H01L 27/146 | (2006.01) |
| H01L 33/62 | (2010.01) |
| H01L 25/04 | (2014.01) |
| H01L 31/14 | (2006.01) |
| H01L 29/78 | (2006.01) |

(52) U.S. Cl.
CPC ...... *H01L 27/14643* (2013.01); *H01L 25/043* (2013.01); *H01L 25/167* (2013.01); *H01L 29/7803* (2013.01); *H01L 31/14* (2013.01); *H01L 33/62* (2013.01); *H01L 29/7802* (2013.01)

(58) Field of Classification Search
CPC ...... H01L 21/4885; H01L 21/70; H01L 21/71
See application file for complete search history.

(56) References Cited

U.S. PATENT DOCUMENTS

2006/0027735 A1* 2/2006 Matsuyama ..... H03K 17/04106
250/214 R

* cited by examiner

*Primary Examiner* — Cheung Lee
(74) *Attorney, Agent, or Firm* — Li & Cai Intellectual Property (USA) Office

(57) ABSTRACT

A photo relay includes an illuminating unit, a photoelectric conversion IC, a first MOS IC and a second MOS IC. The illuminating unit receives an input signal to generate an illuminating signal. The photoelectric conversion IC receives the illuminating signal to generate a voltage control signal accordingly. The second MOS IC is reversely stacked on the first MOS IC, such that the source electrodes of the two MOS ICs are electrically connected, and the gate electrodes of the two MOS ICs are electrically connected through a gate connection structure for receiving the voltage control signal, and the drain electrodes of the two MOS ICs generate an output signal according to the received voltage control signal.

10 Claims, 8 Drawing Sheets

PHOTO RELAY

CROSS REFERENCE TO RELATED APPLICATION

This application claims the benefits of the Taiwan Patent Application Serial NO. 104142310, filed on Dec. 16, 2015 the subject matter of which is incorporated herein by reference.

BACKGROUND OF THE INVENTION

1. Field of the Invention

The present invention is related to a photo relay, particularly to a photo relay with two metal-oxide-semiconductor (MOS) transistors to control the output circuit thereof.

2. Description of the Prior Art

A relay is an electrically operated device with a control system (also known as an input circuit) and a system to be controlled (also known as an output circuit), and is usually used in the automatic control system. The relay is operated as an "automatic switch" to control a large current by using a small current and has the abilities including automatic control, overload or fault protection, signal conversion, etc.

FIG. 1 is a circuit diagram of a conventional photo relay. The photo relay 10 includes an illuminating unit 12, a photoelectric conversion unit 14, and two metal-oxide-semiconductor (MOS) transistors 16, 18. The illuminating unit 12, such as a light emitting diode (LED), is connected to the input ends T1, T2 of the photo relay 10 for receiving a current signal (i.e. the small current) and generating an optical signal (usually an infrared light) based on the current signal. The photoelectric conversion unit 14 includes a photodiode array (not shown). The source electrodes S1, S2 of the two MOS transistors 16, 18 are connected to each other, and the drain electrodes D1, D2 of the two MOS transistors 16, 18 are connected to the output ends T3, T4 of the photo relay 10. After receiving the optical signal from the illuminating unit 12, a voltage change (i.e. a voltage drop) would be induced to change the conduction state of the two MOS transistors 16, 18 and control the current (i.e. the large current) flowing through the two MOS transistors 16, 18.

FIG. 2 is a cross-sectional schematic view of a conventional packaging structure for the photo relay 10 in FIG. 1, and FIG. 2A is a top schematic view showing the photoelectric conversion unit 14 and the two MOS transistors 16, 18 in the lower portion of the packaging structure. Please refer to FIGS. 2 and 2A for the arrangement of the photo relay 10 in the packaging structure The illuminating unit 12 is usually located in the upper portion of the photo relay 10, and the photoelectric conversion unit 14 as well as the two MOS transistors 16, 18 are located in the lower portion of the photo relay 10. In general, the photoelectric conversion unit 14 and the two MOS transistor 16, 18 are separated chips. The illuminating unit 12 is aligned with the photoelectric conversion unit 14, especially the photodiode array (not shown) thereon. The photoelectric conversion unit 14 has at least two output ends electrically connected to the gate electrodes G1, G2 of the two MOS transistors 16, 18 by using bonding wires 19 for controlling the conduction state of the MOS transistors 16, 18. In addition, please referring to FIGS. 1 and 2A, the drain electrodes D1, D2 of the two MOS transistors 16, 18 are located at the bottom of the chips and act as the output ends of the photo relay 10 by connecting to the two pins T1, T2 of the lead frame directly, and the source electrodes S1, S2 of the two MOS transistors 16, 18 are located at the upper surface of the chips and connected with each other by the conductive wire 20.

However, as shown in FIG. 2A, it is needed to preserve a certain area on the lead frame in the lower portion of the packaging structure of the photo relay 10 to locate the three individual electric components or chips (i.e. the photoelectric conversion unit 14 and the two MOS transistors 16, 18). The packaging size of the photo relay would be restricted by the limitation.

SUMMARY OF THE INVENTION

Accordingly, a photo relay is provided in the present invention, which has the potential to reduce the packaging size without the need to change the circuit design, thus the component density of the electronic device can be enhanced.

A photo relay is provided in accordance with an embodiment of the present invention. The photo relay includes a photo coupling device and an output device. The photo coupling device includes an illuminating unit and a photoelectric conversion chip, wherein the illuminating unit is utilized for receiving an input signal to generate an optical signal, the photoelectric conversion chip is utilized for receiving the optical signal and generating at least one voltage control signal according to the received optical signal.

The output device is electrically connected to the photo conversion chip. The output device includes a first MOS transistor chip and a second MOS transistor chip, wherein the second MOS transistor is reversely stacked on the first MOS transistor chip, a source electrode of the first MOS transistor chip is aligned with and electrically connected to a source electrode of the second MOS transistor chip, and a drain electrode of the first MOS transistor and a drain electrode of the second MOS transistor are utilized for outputting an output signal.

The output device includes a gate connection structure. The gate connection structure is located between the first MOS transistor chip and the second MOS transistor chip for connecting a gate electrode of the first MOS transistor chip and a gate electrode of the second MOS transistor chip, and receives the voltage control signal from the photoelectric conversion chip.

In accordance with an embodiment of the present invention, the output device of the photo relay further includes a source connection structure. The source connection structure is located between the first MOS transistor and the second MOS transistor for connecting the source electrode of the first MOS transistor and the source electrode of the second MOS transistor. In a preferred embodiment, the source connection structure may be also electrically connected to a grounded end of the photocoupling device, and the source connection structure may include a copper clip.

In addition, in accordance with an embodiment of the present invention, the photo coupling device and the output device are packaged in one packaging structure, which includes a lead frame. The illuminating unit is located at a first side of the lead frame and is connected to two input pins of the lead frame. The photoelectric conversion chip is located at a second side of the lead frame, which is opposite to the first side. The photoelectric conversion chip has at least one metal pad on an upper surface thereof for outputting the at least one voltage control signal. The drain electrode of the first MOS transistor chip and the drain electrode of the second MOS transistor chip are connected to two output pins of the lead frame respectively. The gate connection structure extends outward to connect the at least one metal pad of the photoelectric conversion chip.

In accordance with the above mentioned embodiment in which the photo coupling device and the output device are packaged in single packaging structure, the source connection structure may extend outward to connect a grounded pin of the lead frame. In a preferred embodiment, the source connection structure and the grounded pin may be formed in one piece, connected by using a conductive wire, or connected by using the copper clips.

In addition, in accordance with an embodiment of the present invention, the gate connection structure may include at least one copper clip. For example, the gate connection structure may include a first copper clip and a second copper clip, wherein the first copper clip connects the gate electrode of the first MOS chip and the gate electrode of the second MOS chip, the second copper clip is connected to the at least one metal pad on the upper surface of the photoelectric conversion chip and is engaged with the first copper clip.

In addition, in accordance with an embodiment of the present invention, the drain electrode of the second MOS chip is electrically connected to one of the output pins of the lead frame through a conductive wire.

In summary, by using the technology provided in the present invention, the packaging size of the photo relay can be effectively reduced without the need to change the circuit design, thus the component density of the electronic device can be enhanced.

BRIEF DESCRIPTION OF THE DRAWINGS

Other features and advantages of this invention will become more apparent in the following detailed description of the preferred embodiments of this invention, with reference to the accompanying drawings, in which.

DETAILED DESCRIPTION OF THE PREFERRED EMBODIMENTS

Figure 1:
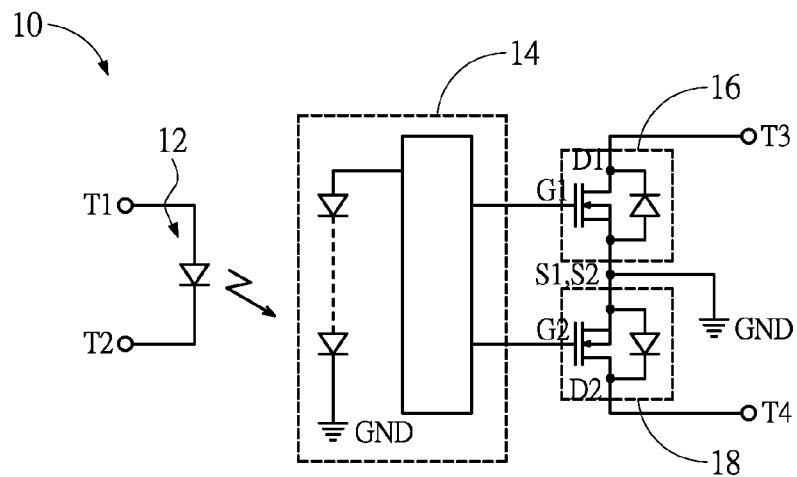
FIG. 1 is a circuit diagram of a conventional photo relay.
Figure 2:
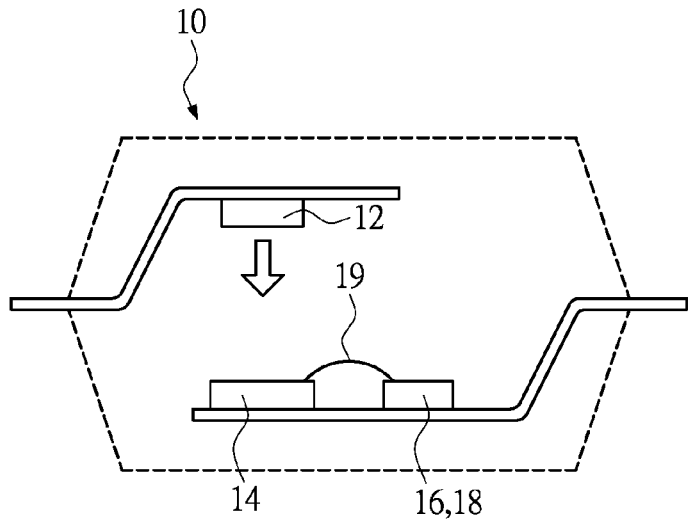
FIG. 2 is a cross-sectional schematic view of a conventional packaging structure for the photo relay of FIG. 1.
Figure 2A:
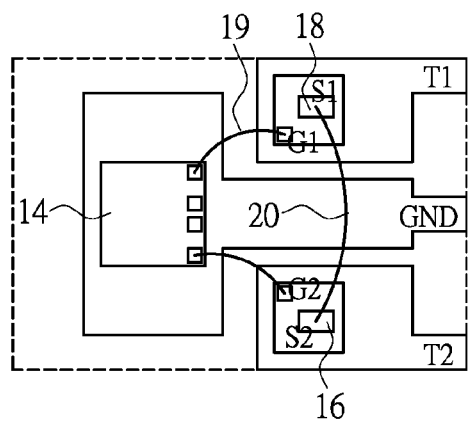
FIG. 2A is a top schematic view of the lower portion of the packaging structure of FIG. 2.
Figure 3:
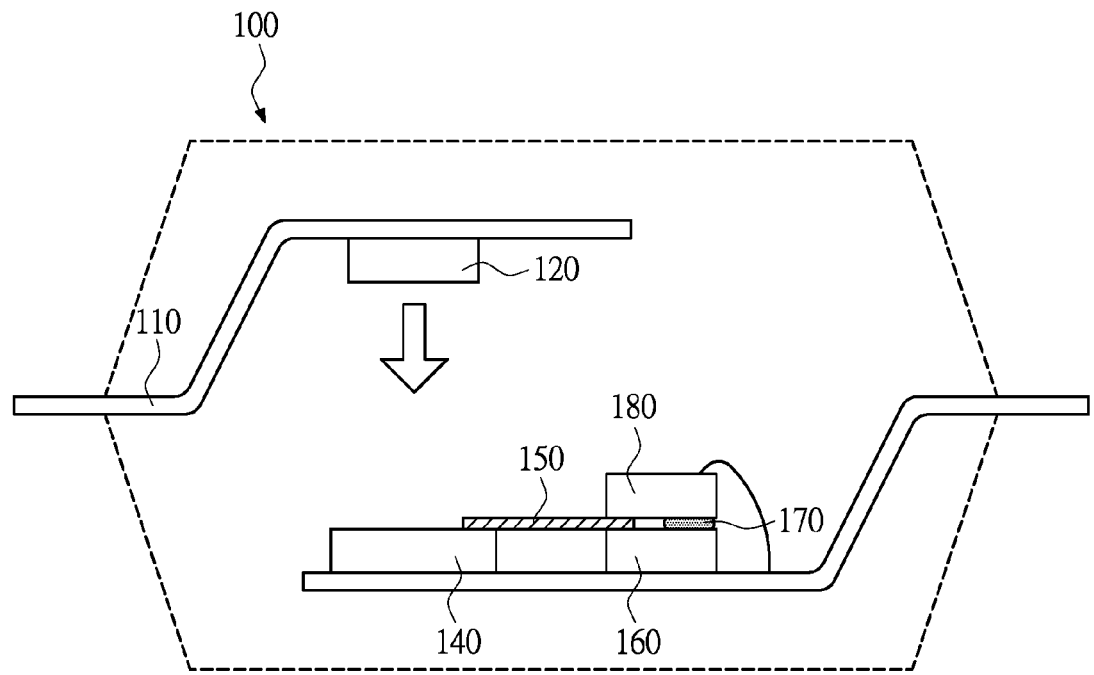
FIG. 3 is a cross-sectional schematic view of a packaging structure of a photo relay in accordance with a first embodiment of the present invention.
Figure 3A:
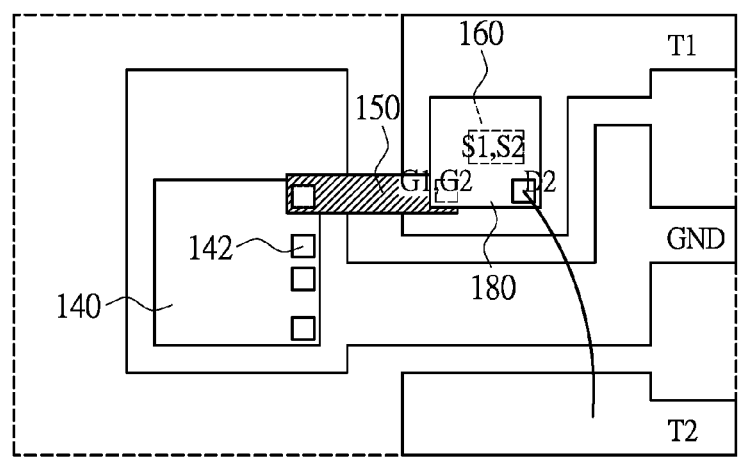
FIG. 3A is a top schematic view of the packaging structure in FIG. 3.

Please refer to FIGS. 3 and 3A, wherein FIG. 3 is a cross-sectional schematic view of a packaging structure of a photo relay in accordance with a first embodiment of the present invention and FIG. 3A is a top schematic view of the packaging structure in FIG. 3. The photo relay 100 includes a photo coupling device and an output device. The photo coupling device and the output device are packaged in the same packaging structure and located on the lead frame 110 of the packaging structure. The photo coupling device includes an illuminating unit 120 and a photoelectric conversion chip 140. The illuminating unit 120 is located at a first side of the lead frame 110 (i.e. the upper portion of the lead frame 110 in FIG. 3) for connecting to the two input pins (not shown in drawings) of the lead frame 110. The photoelectric conversion chip 140 is located at a second side of the lead frame 110 (i.e. the lower portion of the lead frame in FIG. 3). The illuminating unit 120 illuminates in a downward direction, the photoelectric conversion chip 140 has a light-receiving surface facing upward, and the light-receiving surface is substantially aligned with the illuminating unit 120 for receiving the light from the illuminating unit 120. The illuminating unit 120, such as a light emitted diode (LED), receives an input signal (usually a small current signal) through the input pins of the lead frame 110 and generates an optical signal according to the input signal. The photoelectric conversion chip 140 has a photo-electric unit array, such as a photo diode array, for receiving the optical signal from the illuminating unit 120. The photoelectric conversion chip 140 includes a conversion circuit for converting the output signal from the photo-electric unit array into a voltage control signal, and outputs the voltage control signal through at least one metal pad 142 on an upper surface of the photoelectric conversion chip 140 to the output device. The photoelectric conversion chip 140 in the present embodiment has four metal pads 142 to output the voltage control signal. However, the present invention does not intend to limit the number of the metal pads 142.

Figure 3B:
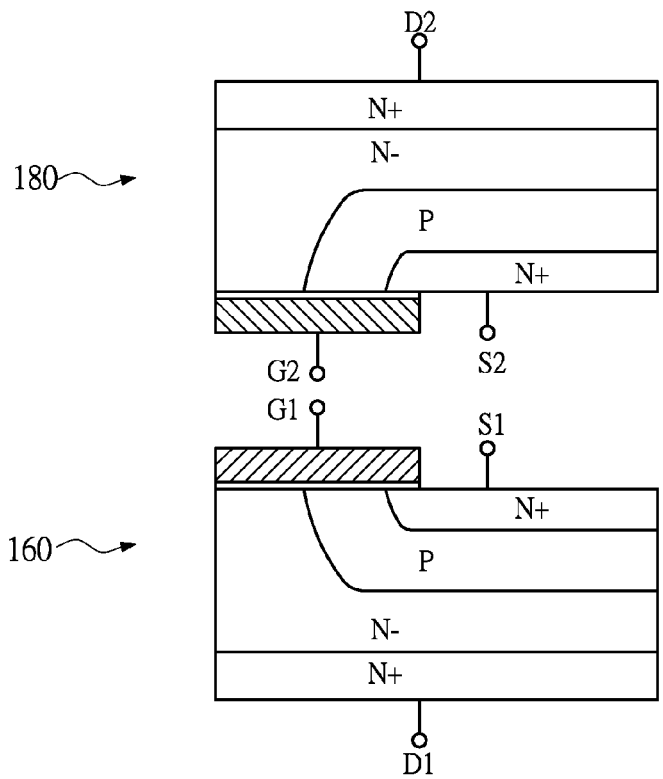
FIG. 3B is a schematic view showing the two stacked MOS transistors in the output device of the photo relay in accordance with an exemplary embodiment of the present invention.

The output device includes a first MOS transistor chip 160 and a second MOS transistor chip 180. FIG. 3B is a schematic view showing the two stacked MOS transistors 160, 180 in the output device of the photo relay in accordance with an exemplary embodiment of the present invention. As shown, the two MOS transistor chips 160, 180 are both vertical diffused MOS (VDMOS) transistor chips. A source electrode S1 and a drain electrode D1 of the first MOS transistor chip 160 are located at opposite sides, but a gate electrode G1 of the first MOS transistor chip 160 and the source electrode S1 are located at the same side. Similarly, a source electrode S2 and a drain electrode D2 of the second MOS transistor chip 180 are located at opposite sides, but a gate electrode G2 of the second MOS transistor chip 180 and the source electrode S2 are located at the same side. In addition, the second MOS transistor chip 180 is reversely stacked on the first MOS transistor chip 160. That is, the source electrode Si and the gate electrode G1 of the first MOS transistor chip 160 are located on the upper surface thereof but the drain electrode D1 is located on the lower surface thereof, the source electrode S2 and the gate electrode G2 of the second MOS transistor chip 180 are located on the lower surface thereof, but the drain electrode D2 is located on the upper surface thereof. However, the present invention does not intend to limit the arrangement of the MOS transistor chips 160, 180.

Figure 3C:
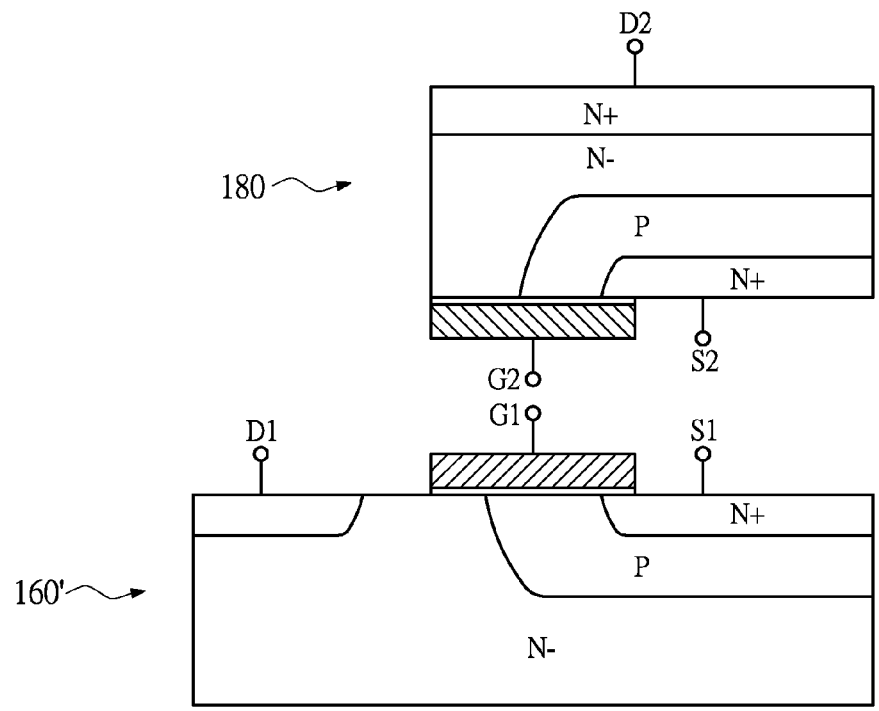
FIG. 3C is a schematic view showing the two stacked MOS transistors in the output device of the photo relay in accordance with another exemplary embodiment of the present invention.

In accordance with another embodiment of the present invention, please refer to FIG. 3C, a laterally diffused MOS transistor chip may be used as the first MOS transistor chip 160', in which the source electrode S1, the gate electrode G1, and the drain electrode D1 are all located on the upper surface thereof. The second MOS transistor chip 180, on the other hand, is a VDMOS transistor chip. The second MOS transistor chip 180 is reversely stacked on the gate electrode G1 and the source electrode Si of the first MOS transistor chip 160', but the drain electrode D1 of the first MOS transistor chip 160 is exposed to facilitate the following wire bonding process.

In addition, the source electrode S1 of the first MOS transistor chip 160 is aligned with and electrically connected to the source electrode S2 of the second MOS transistor chip 180. In a preferred embodiment, the source electrodes S1, S2 of the two MOS transistor chips 160, 180 may be connected by using conductive paste, solder ball, or other suitable electrical connection means. Moreover, the drain electrode D1 of the first MOS transistor chip 160 and the drain electrode D2 of the second MOS transistor chip 180 are electrically connected to two separate output pins T1, T2 of the lead frame 110 respectively for generating and outputting an output signal (i.e. the large current signal). In a preferred embodiment, the first MOS transistor chip 160 at the bottom is placed on the base of the lead frame 110 that connected to the output pin T1 directly so the drain electrode D1 is connected to the output pin T1. On the other hand, the drain electrode D2 of the second MOS transistor chip 180 at the top is electrically connected to the output pin T2 by wire bonding or ribbon bonding. However, the present invention does not intend to limit the arrangement of wire bonding to this embodiment.

In addition, the output device also includes a gate connection structure 150. The gate connection structure 150 is located between the first MOS transistor chip 160 and the second MOS transistor chip 180 for connecting the gate electrode G1 of the first MOS transistor chip 160 and the gate electrode G2 of the second MOS transistor chip 180, and receives the voltage control signal from the photoelectric conversion chip 140. In the present embodiment, the gate connection structure 150 includes a metal plate (such as a copper clip) disposed between the first MOS transistor chip 160 and the second MOS transistor chip 180. The upper surface of the metal plate is connected to the gate electrode G1 of the first MOS transistor chip 160, and the lower surface of the metal plate is connected to the gate electrode G2 of the second MOS transistor chip 180. In addition, the metal plate is extended from the two MOS transistor chips 160, 180 toward the photoelectric conversion chip 140, and further connected to the at least one metal pad 142 on the photoelectric conversion chip 140 (one metal pad 142 is connected in FIG. 3A). Thereby, the voltage control signal outputted by the photoelectric conversion chip 140 can be used to control the conduction state of the two MOS transistor chips 160, 180 simultaneously.

As for the assembling process of the chips, for example, the first MOS transistor chip 160 and the photoelectric conversion chip 140 is fixed on the lead frame 110 first, and then the gate connection structure 150 (such as the metal plate) is placed on and fixed to the first MOS transistor chip 160 and the photoelectric conversion chip 140. Finally, the second MOS transistor chip 180 is placed on and fixed to the gate connection structure 150. The above mentioned metal plate can be replaced by using the aluminum bonding ribbon. It is noted that the above mentioned embodiment has the gate electrodes G1, G2 of the MOS transistor chips 160, 180 connected to the metal pad 142 on the photoelectric conversion chip 140 by using the extension of the metal plate. However, the present invention does not intend to limit the method of connecting the MOS transistor chips 160, 180 and the photoelectric conversion chip 140.

Figure 4:
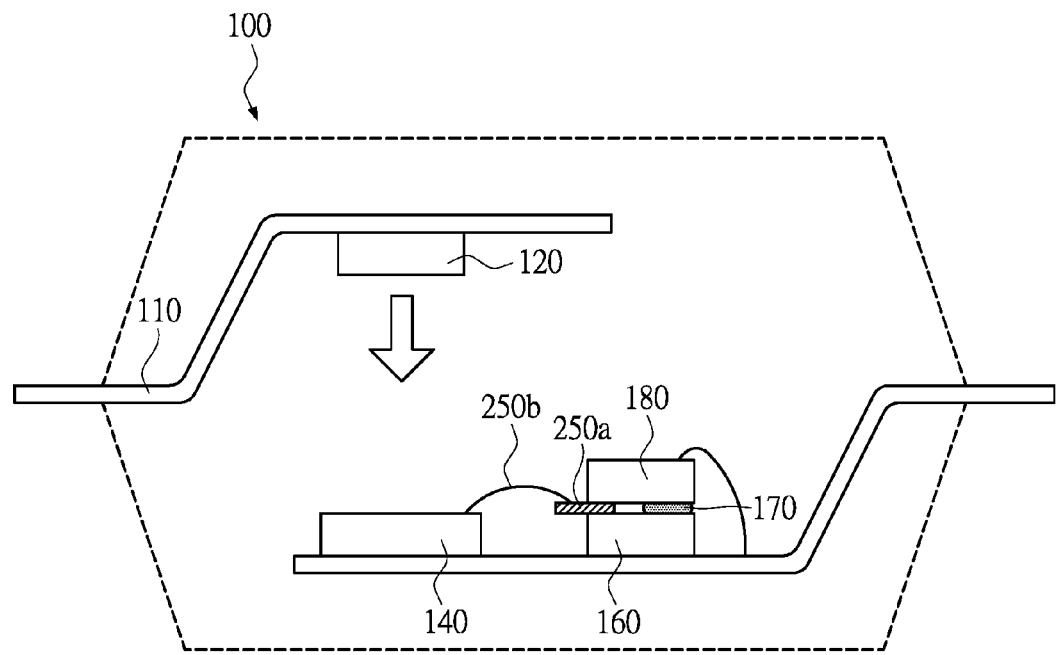
FIGS. 4 and 4A are schematic views showing the gate connection structure in accordance with an exemplary embodiment of the present invention.
Figure 4A:
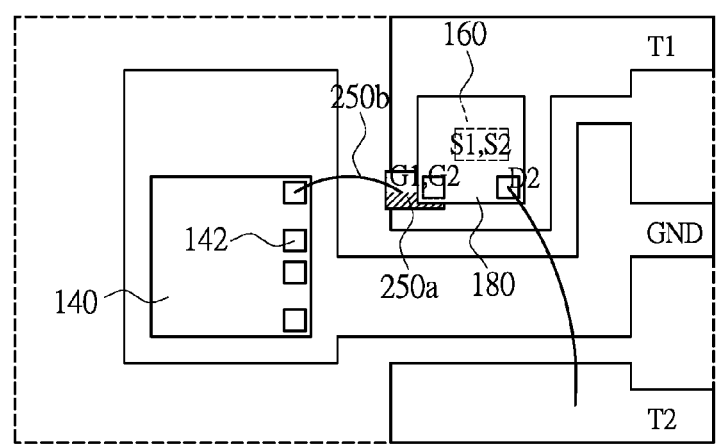

Please refer to FIGS. 4 and 4A, in accordance with another embodiment of the gate connection structure in the present invention, the gate connection structure includes a metal plate 250a and a bonding wire 250b (or a bonding ribbon).Specifically, the metal plate 250a (such as the above mentioned copper clip) is disposed between the two MOS transistor chips 160, 180, and the two opposite surfaces of the metal plate 250a are connected to the gate electrodes G1, G2 of the two MOS transistor chips 160, 180 respectively. In addition, the metal plate 250a is extended outside the two MOS transistor chips 160, 180 and has at least one exposed surface. The bonding wire 250b connects the exposed surface of the metal plate 250a and the metal pad 142 on the photoelectric conversion chip 140.

Figure 4B:
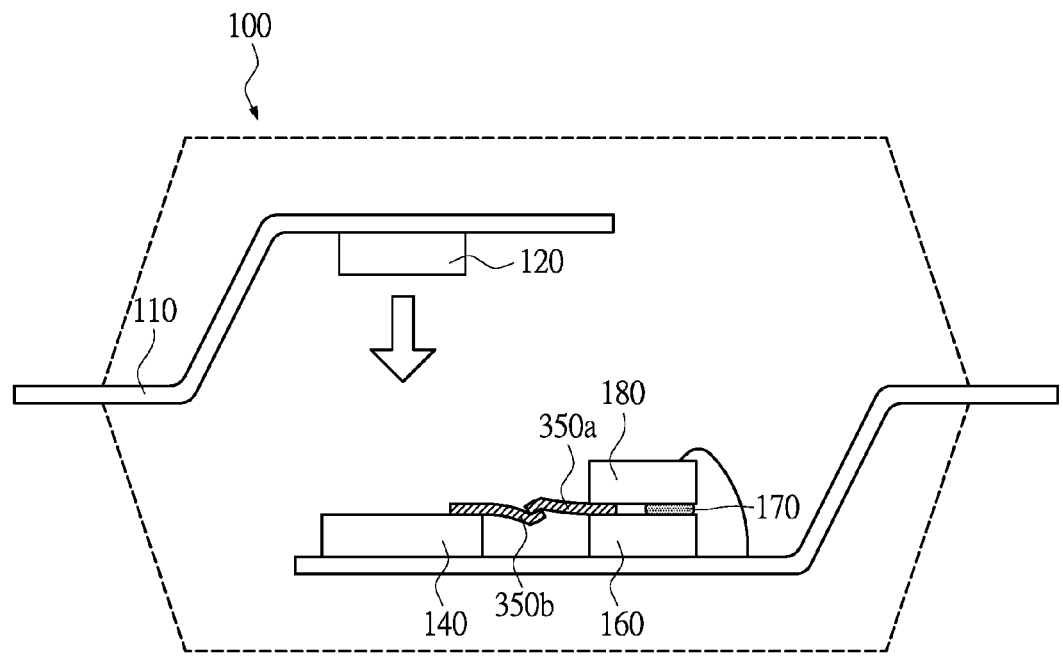
FIGS. 4B and 4C are schematic views showing the gate connection structure in accordance with another exemplary embodiment of the present invention.
Figure 4C:
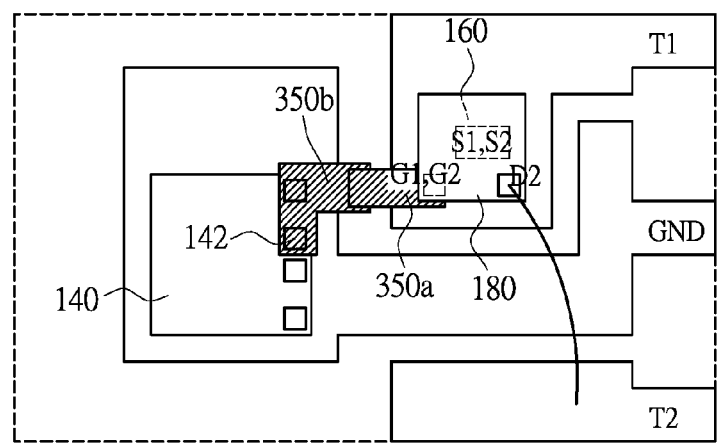

Please refer to FIGS. 4B and 4C, in accordance with another embodiment of the gate connection structure in the present invention, the gate connection structure includes a first copper clip 350a and a second copper clip 350b, wherein the first copper clip 350a connects the gate electrode G1 of the first MOS transistor chip 160 and the gate electrode G2 of the second MOS transistor chip 180, and the second copper clip 350b is connected to the metal pad 142 on the upper surface of the photoelectric conversion chip 140. The first copper clip 350a is engaged with the second copper clip 350b to have the metal pad 142 on the photoelectric conversion chip 140, the gate electrode G1 of the first MOS transistor chip 160 and the gate electrode G2 of the second MOS transistor chip 180 electrically connected.

Figure 5:
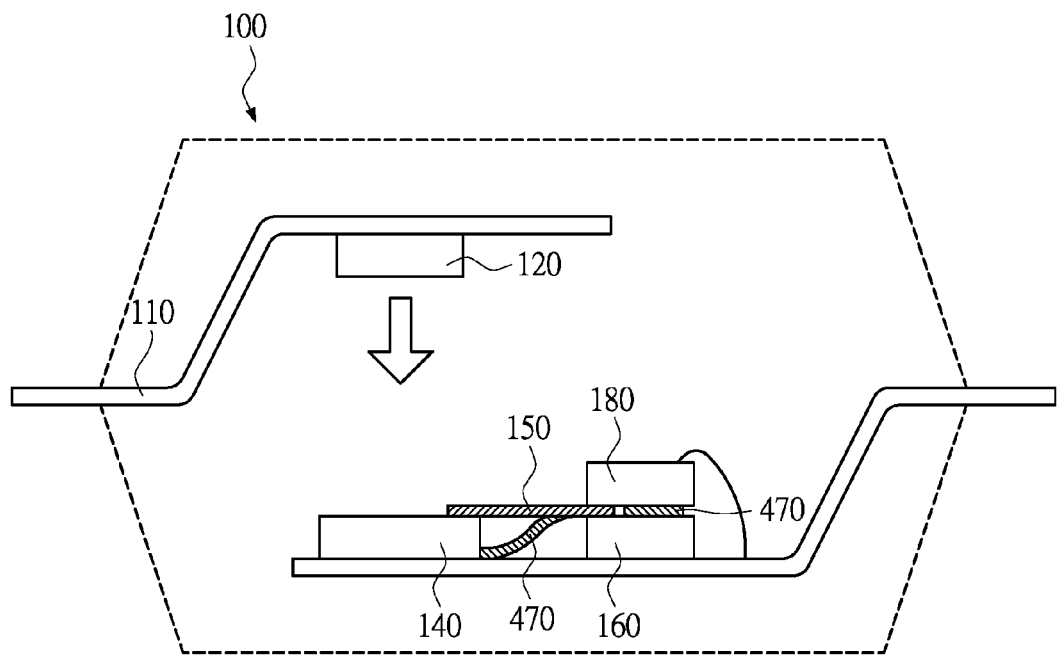
FIG. 5 is a cross-sectional schematic view of a packaging structure of a photo relay in accordance with a second embodiment of the present invention.
Figure 5A:
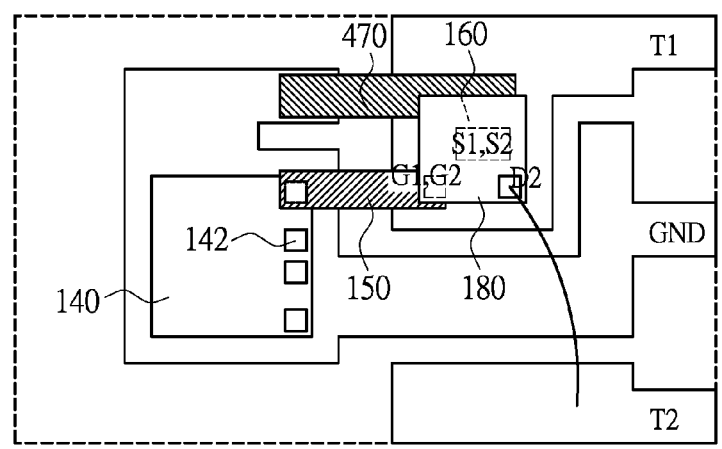
FIG. 5A is a top schematic view of the packaging structure of FIG. 5.

Please refer to FIGS. 5 and 5A, wherein FIG. 5 is a cross-sectional schematic view of a packaging structure of a photo relay in accordance with a second embodiment of the present invention, and FIG. 5A is a top schematic view of the packaging structure in FIG. 5. Unlike the embodiment shown in FIG. 3A that the source electrodes S1, S2 of the two MOS transistor chips 160, 180 are directly connected without the bonding means such as copper clip, aluminum ribbon, or bonding wire, the output device of the photo relay in FIGS. 5 and 5A further includes a source connection structure 470. The source connection structure 470 is located between the first MOS transistor chip 160 and the second MOS transistor chip 180 for electrically connecting the source electrode S1 of the first MOS transistor chip 160 and the source electrode S2 of the second MOS transistor chip 180. In the present embodiment, the source connection structure 470 includes a metal plate (e.g. a copper clip) disposed between the first MOS transistor chip 160 and the second MOS transistor chip 180. The lower surface of the metal plate is connected to the source electrode S1 of the first MOS transistor chip 160, and the upper surface of the metal plate is connected to the source electrode S2 of the second MOS transistor chip 180. In addition, the metal plate is extended outward from the two MOS transistor chips 160, 180 to connect a grounded pin GND of the lead frame 110 (usually the grounded end of the photo coupling device). In the present embodiment, the photoelectric conversion chip 140 is directly placed on a base connected to the grounded pin GND of the lead frame 110 for accessing the grounded potential. Note the above mentioned embodiment uses the extension of the metal plate to connect the source electrodes S1, S2 of the two MOS transistor chips 160, 180 directly and have the source electrodes S1, S2 grounded. However, the present invention does not intend to limit the connection and grounding of the source electrodes S1, S2.

Figure 6:
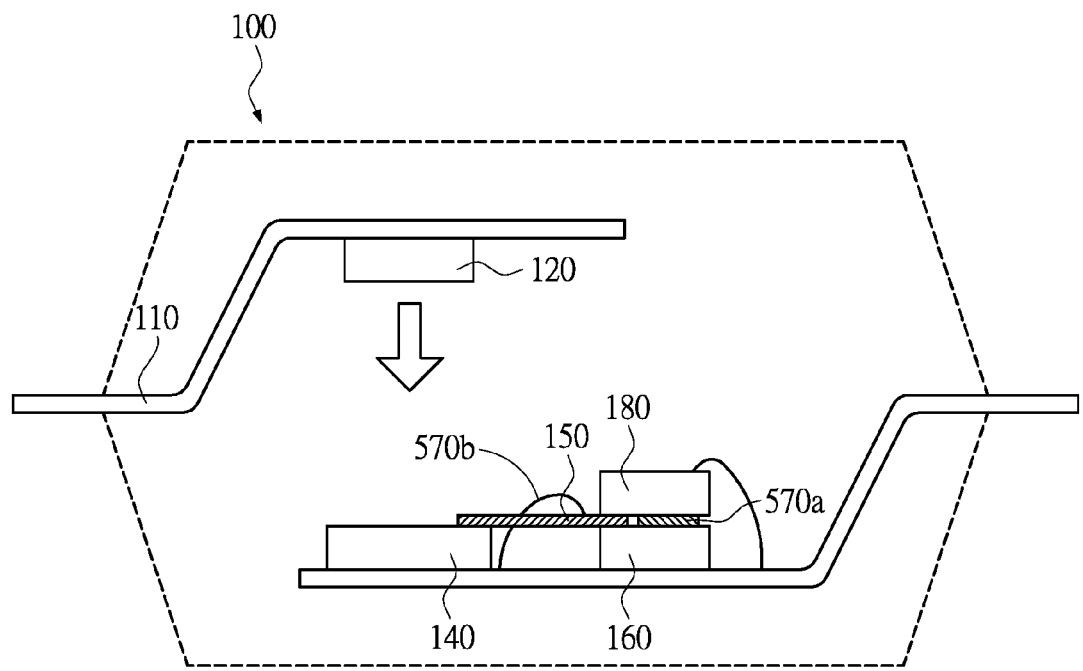
FIGS. 6 and 6A are schematic views showing the source connection structure in accordance with an exemplary embodiment of the present invention.
Figure 6A:
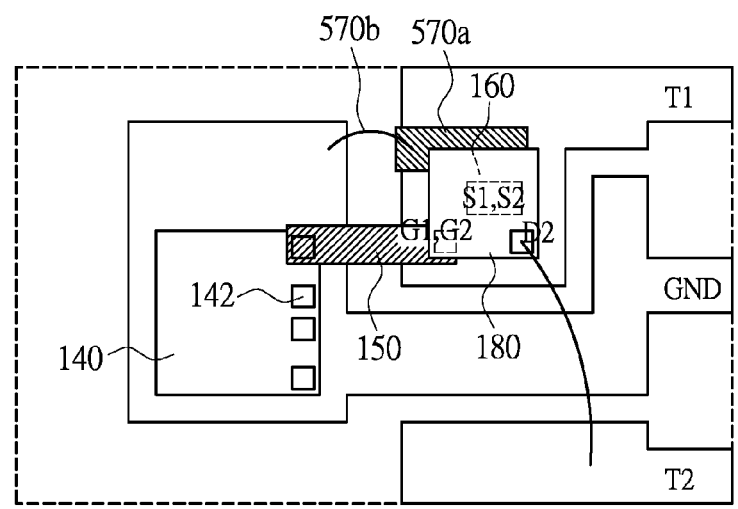

Please refer to FIGS. 6 and 6A, which are the schematic views showing the source connection structure in accordance with an exemplary embodiment of the present invention. In this embodiment, the source connection structure includes a metal plate 570a and a bonding wire 570b (or bonding ribbon).Specifically, the metal plate 570a (which may be the copper clip) is disposed between the two MOS transistor chips 160, 180 and is extended outside the two MOS transistor chips 160, 180 to show at least one exposed surface. The bonding wire 570b connects the exposed surface of the metal plate 570a and the grounded pin GND of the lead frame 110.

Figure 6B:
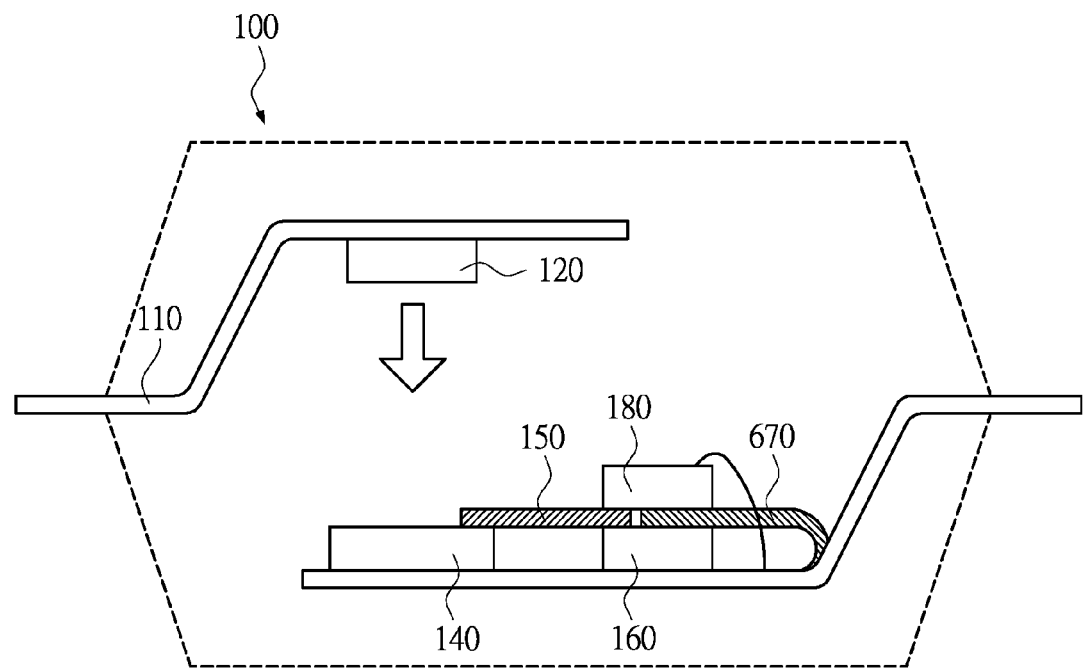
FIGS. 6B and 6C are schematic views showing the source connection structure in accordance with another exemplary embodiment of the present invention.
Figure 6C:
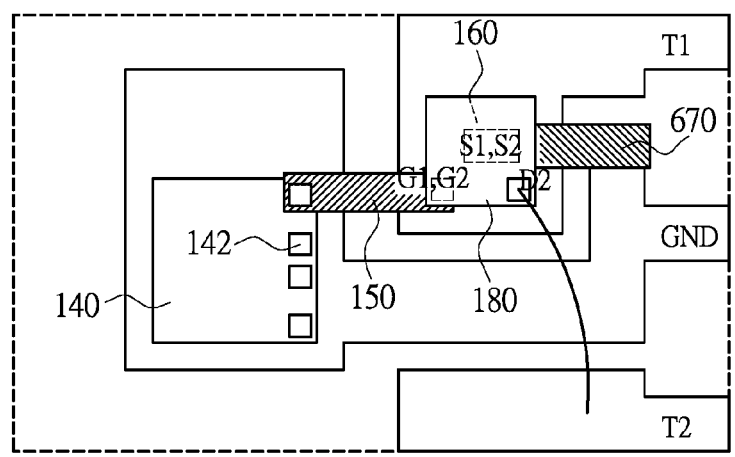

Please refer to FIGS. 6B and 6C, which are the schematic views showing the source connection structure in accordance with another exemplary embodiment of the present invention. In this embodiment, the source connection structure includes a metal plate 670 extended to the grounded pin GND of the lead frame 110. In addition, the metal plate 670 and the grounded pin GND of the lead frame 110 are formed in one piece. That is, the metal plate 670 is a part of the lead frame 110, which is bended as the connection structure for connecting the two MOS transistor chips 160, 180.

In the above mentioned first and second embodiments, the photo coupling device (including the illuminating unit and the photoelectric conversion chip) and the output device (including the two MOS transistor chips) are packaged in single packaging structure. However, the present invention does not intend to limit the arrangement of packaging. In accordance with another embodiment of the present invention, the photo coupling device and the output device may be packaged in two separate packaging structures. To be more specific, in the packaging structure of the photo coupling device, the illuminating unit and the photoelectric conversion chip are located at opposite sides of the packaging structure, the illuminating unit is connected to the input pins of the packaging structure for receiving an input signal (i.e. the small current signal), and the photoelectric conversion chip is connected to at least one output pin and a grounded pin of the packaging structure for outputting the voltage control signal. The two MOS transistor chips are stacked face-to-face in another packaging structure, the gate electrodes of the two MOS transistor chips are electrically connected to the input pin of the packaging structure for receiving the voltage control signal from the photo coupling device, and the drain electrodes of the two MOS transistor chips are connected to the output pins of the packaging structure for generating and outputting an output signal (i.e. the large current signal). A person having ordinary skill in the art may modify the design according to practical needs, for example, the source electrodes of the two MOS transistor chips may be connected to the grounded pin of the photo coupling device through the grounded pin of the packaging structure. The connection between the gate electrodes and the source electrodes of the two MOS transistor chips can be referred to the first and second embodiments of the present invention, which is not repeated here.

By using the technology provided in the embodiments of the present invention, the area in the packaging structure for locating a transistor chip can be saved. Thus, the packaging size of the photo relay can be effectively reduced without the need to change the circuit design. In addition, by using the advanced packaging technology such as copper clip and aluminum ribbon, the packaging process can be simplified, and the resistance of the two MOS transistor chips can be reduced to further decease power consumption of the photo relay.

While the invention has been described in connection with what is considered the most practical and preferred embodiments, it is understood that this invention is not limited to the disclosed embodiments. All changes, alterations, or modifications conveniently considered by those skilled in the art are deemed to be encompassed within the scope of the present invention delineated by the following claims.

What is claimed is:

1. A photo relay comprising:
a photo coupling device, including an illuminating unit and a photoelectric conversion chip, wherein the illuminating unit is utilized for receiving an input signal to generate an optical signal, and the photoelectric conversion chip is utilized for receiving the optical signal to generate at least one voltage control signal according to the received optical signal;
an output device electrically connected to the photoelectric conversion chip, and including a first MOS transistor chip and a second MOS transistor chip, wherein the first MOS transistor chip and the second MOS transistor chip are vertical diffused MOS (VDMOS) transistor chips, the second MOS transistor chip is reversely stacked on the first MOS transistor chip, a source electrode of the first MOS transistor chip is aligned with and electrically connected to a source electrode of the second MOS transistor chip, and a drain electrode of the first MOS transistor chip and a drain electrode of the second MOS transistor chip generate an output signal; and
a source connection structure located between the first MOS transistor chip and the second MOS transistor chip, for connecting the source electrode of the first MOS transistor chip and the source electrode of the second MOS transistor chip, wherein the source connection structure is electrically connected to a grounded end of the photo coupling device;
wherein the output device includes a gate connection structure, which is located between the first MOS transistor chip and the second MOS transistor chip for connecting a gate electrode of the first MOS transistor chip and a gate electrode of the second MOS transistor chip, and receives the voltage control signal from the photoelectric conversion chip.

2. The photo relay of claim 1, wherein the photo coupling device and the output device are packaged in one packaging structure, the packaging structure includes a lead frame, the illuminating unit is located at a first side of the lead frame and is connected to two input pins of the lead frame, the photoelectric conversion chip is located at a second side of the lead frame which is opposite to the first side, the photoelectric conversion chip has at least one metal pad disposed on an upper surface thereof for outputting the at least one voltage control signal, the drain electrode of the first MOS transistor chip and the drain electrode of the second MOS transistor chip are connected to two output pins of the lead frame respectively, and the gate connection structure is extended outward to connect the at least one metal pad.

3. The photo relay of claim 2, wherein the drain electrode of the second MOS transistor is connected to one of the output pins of the lead frame through a conductive wire.

4. The photo relay of claim 1, wherein the source connection structure includes a copper clip.

5. The photo relay of claim 1, wherein the source connection structure is extending outward to connect a grounded pin of a lead frame.

6. The photo relay of claim 5, wherein the source connection structure and the grounded pin are formed in one piece.

7. The photo relay of claim 5, wherein the source connection structure is connected to the grounded pin of the lead frame through a conductive wire.

8. The photo relay of claim 1, wherein the gate connection structure includes at least one copper clip.

9. The photo relay of claim 8, wherein the gate connection structure includes a first copper clip and a second copper clip, the first copper clip is connected to the gate electrode of the first MOS transistor chip and the gate electrode of the second MOS transistor chip, and the second copper clip is connected to at least one metal pad and engaged with the first copper clip.

10. The photo relay of claim 1, wherein the photo coupling device and the output device are packaged in two separate packaging structures respectively.

* * * * *